United States Patent
Sandgren et al.

(10) Patent No.: US 12,049,141 B2
(45) Date of Patent: Jul. 30, 2024

(54) MOTOR DRIVE, A METHOD AND A CONTROL UNIT FOR HANDLING CONNECTION BETWEEN A MOTOR DRIVE AND A TVS IN AN AT LEAST PARTLY ELECTRICALLY OPERATED VEHICLE

(71) Applicant: VOLVO TRUCK CORPORATION, Gothenburg (SE)

(72) Inventors: Victor Sandgren, Gothenburg (SE); Per Widek, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 101 days.

(21) Appl. No.: 17/660,927

(22) Filed: Apr. 27, 2022

(65) Prior Publication Data

US 2022/0348085 A1 Nov. 3, 2022

(30) Foreign Application Priority Data

Apr. 29, 2021 (EP) .................................... 21171097

(51) Int. Cl.
*B60L 3/00* (2019.01)
*B60W 20/00* (2016.01)
*G01R 31/52* (2020.01)
*H02K 3/28* (2006.01)

(52) U.S. Cl.
CPC ............ *B60L 3/0069* (2013.01); *G01R 31/52* (2020.01); *H02K 3/28* (2013.01); *B60W 20/00* (2013.01)

(58) Field of Classification Search
CPC ......... B60L 3/0069; G01R 31/52; H02K 3/28; B60W 20/00
See application file for complete search history.

(56) References Cited

U.S. PATENT DOCUMENTS 6,856,137 B2 * 2/2005 Roden .................. B60L 3/0061
324/509
9,783,193 B2 * 10/2017 Lasson .................. B60W 20/50

FOREIGN PATENT DOCUMENTS

CN 103368239 A * 10/2013 .......... B60L 11/1814
EP 1336528 A2 8/2003

OTHER PUBLICATIONS

Machine Translation of CN103368239A PDF File Name: "CN103368239A_Machine_Translation.pdf".*
European Search Report dated Oct. 22, 2021 in corresponding European Patent Application No. 21171097.5, 11 pages.

* cited by examiner

*Primary Examiner* — Grant Moubry
*Assistant Examiner* — Ruben Picon-Feliciano
(74) *Attorney, Agent, or Firm* — Venable LLP; Jeffri A. Kaminski

(57) ABSTRACT

A motor drive in a an at least partly electrically operated vehicle. Motor windings are connected to a positive pole of a TVS and a capacitor is connected to a negative pole when a first, third and sixth connecting units are in connected state and when a second, fourth and fifth connecting units are in disconnected state. The motor windings are connected to a negative pole of the TVS and the capacitor is connected to the positive pole when the first, third and sixth connecting units are in disconnected state and when the second, fourth and fifth connecting units are in connected state.

14 Claims, 9 Drawing Sheets

MOTOR DRIVE, A METHOD AND A CONTROL UNIT FOR HANDLING CONNECTION BETWEEN A MOTOR DRIVE AND A TVS IN AN AT LEAST PARTLY ELECTRICALLY OPERATED VEHICLE

TECHNICAL FIELD

The invention relates to a method, a control unit, an at least partly electrically operated vehicle or vessel The invention can be applied in at least partly electrical heavy-duty vehicles, such as trucks, buses and construction equipment etc. Although the invention will be described with respect to a fully electrified truck, the invention is not restricted to this particular vehicle, but may also be used in other vehicles such as buses, trailers, wheel loaders, articulated haulers, excavators, backhoe loaders, passenger cars, marine vessels, construction equipment etc. It may also be applied in electrical systems of e.g., electrically operated vessels and in various industrial construction machines or working machines. It is applicable in fully electrically operated vehicles as well as in hybrid vehicles, comprising also a combustion engine. The term vehicle will be used herein for the sake of simplicity when referring any of the above exemplified vehicles.

BACKGROUND

The drivetrain in an at least partly electrically operated vehicle often comprises an isolated terra Traction Voltage System (TVS) supplying an electrical machine through a motor drive. The drivetrain may be described as the system comprised in the vehicle that delivers power to the driving wheels. In an isolated terra TVS, none of the TVS poles have a direct connection to chassis ground. The lack of direct connection to chassis ground is a reason for swings or jumps in the TVS voltages in relation to chassis ground when the motor drive is active. A terra TVS may be referred to as a floating system.

FIG. 1 is a schematic drawing illustrating a motor drive 101 connected to a TVS 103. The motor drive 101, illustrated with a dotted box, comprises a first connecting unit S1, a second connecting unit S2, a third connecting unit S3 and a fourth connecting unit S4. Each of the first connecting unit S1, a second connecting unit S2, a third connecting unit S3 and a fourth connecting unit S4 are either in connected state or disconnected state.

The motor drive 101 switches the current through its motor windings 105. As part of the switching cycle, the motor windings 105 will alternately be connected to the positive pole and the negative pole of the TVS 103 when the connecting units S1, S2, S3 and S4 switches between connected state and disconnected state in a certain fashion. Stray capacitance C1 in the motor windings 105 and connecting cables will pull the chassis potential towards the positive TVS potential or the negative TVS potential, respectively. In other words, the stray capacitance C1 is an unwanted capacitance between the motor windings 105 and a first chassis ground CH1. The stray capacitance C1 may be referred to as a first capacitance herein. This creates a common mode TVS voltage ripple and can lead to problems with e.g., electromagnetic interference. As part of a switching cycle, the stray capacitance C1 will be connected to the traction voltage positive and negative pole, causing the pole-chassis voltage to swing. This is indicated by the dotted arrow in FIG. 2. The top line which alternates up and down represents TVS+ and the bottom line which alternates up and down in the same phase as the top line represents TVS−. The x-axis of FIG. 2 represents time. The part of the two lines that are between the dotted vertical lines represents a switching cycle. As seen from FIG. 2, when the motor windings 105 are connected to TVS+, then the stray capacitance C1 pulls TVS+ towards the first chassis ground CH1.

Stray capacitance, also referred to as parasitic capacitance, may be described as an unavoidable and usually unwanted capacitance that exists between the parts of an electronic component or circuit because of their proximity to each other.

Today, a passive filter capacitor is connected between the positive pole of the TVS and chassis ground, connected between the negative pole of the TVS and chassis ground or both, and this would counteract or at least decrease the TVS to chassis voltage swing or chassis voltage ripple introduced by the motor drive. This chassis voltage ripple leads to electromagnetic interference in other components of the vehicle which may be referred to as noise. Today, the passive filter capacitor is used to counteract the noise. However, the dimension of this capacitor is not large enough.

Therefore, there is a need to at least mitigate or solve this issue.

SUMMARY

An object of the invention is to provide an improved motor drive in an at least partly electrically operated vehicle.

According to a first aspect of the invention, the motor drive comprises a first connecting unit and a second connecting unit connected to a Traction Voltage System (TVS) and to a first side of motor windings. The motor drive comprises a third connecting unit and a fourth connecting unit connected to the TVS and to a second side of the motor windings. The first side is opposite of the second side. The motor drive comprises a fifth connecting unit and a sixth connecting unit. The motor drive comprises a capacitor connected between the fifth connecting unit and the sixth connecting unit. The motor windings are connected to a positive pole of the TVS and the capacitor is connected to a negative pole of the TVS when the first connecting unit, the third connecting unit and the sixth connecting unit are in a connected state and when the second connecting unit, the fourth connecting unit and the fifth connecting unit are in a disconnected state. The motor windings are connected to the negative pole of the TVS and the capacitor is connected to the positive pole of the TVS when the first connecting unit, the third connecting unit and the sixth connecting unit are in the disconnected state and when the second connecting unit, the fourth connecting unit and the fifth connecting unit are in the connected state. By the provision of a motor drive which comprises a dedicated capacitor connected to the positive or negative pole of the TVS in opposite phase of the motor windings being connected to the positive or negative pole of the TVS, then this provides an advantage of counteracting the swing in pole to chassis voltage. In other words, an advantage is that the risk for common mode TVS voltage ripple is reduced or eliminated. A further advantage is that the risk of problems with e.g., electromagnetic interference is reduced or eliminated.

Optionally, the capacitor may be further connected to a second chassis ground. Hereby an improvement is that the swing in pole to chassis voltage is counteracted. A further advantage is that the risk for common mode TVS voltage ripple is reduced. A further advantage is that the risk of problems with e.g., electromagnetic interference is reduced.

Optionally, there may be a first capacitance between the motor windings and a first chassis ground. The capacitor may have a second capacitance, and the first capacitance and the second capacitance may be approximately the same. The first capacitance, also referred to as stray capacitance, is present between the motor windings and the chassis, and it is an advantage if the second capacitance is as close as possible to the first capacitance in size in order to counteract or at least reduce the voltage swing or voltage ripple, and hence the noise. When the first capacitance and the second capacitance are approximately the same, advantage is that the voltage swing is minimized. The closer the second capacitance is in size to the first capacitance, the less TVS voltage ripple. The size of the first capacitance may be known, it may be known with some uncertainty or it may be unknown. The second capacitance may be variable and dynamically adjusted based on the observed voltage ripple.

Optionally, the capacitor, the fifth connecting unit and the sixth connecting unit may be comprised in a filter. An advantage of this may be that the filter, which may be a standalone unit, is easy to remove, replace and maintain.

Optionally, the first connecting unit, the second connecting unit, the third connecting unit, the fourth connecting unit, the fifth connecting unit and the sixth connecting unit may be mechanical connecting units or semiconductor units.

Optionally, the motor drive may comprise one or more sets of motor windings. An advantage of one set of motor windings is that it may be small in size and has a lower cost compared to multiple sets of windings. More motor windings gives and advantage of a smoother operation of the motor.

According to a second aspect of the invention, the object is achieved by a method performed by a control unit for handling connection between a motor drive and a TVS in an at least partly electrically operated vehicle The motor drive comprises a first connecting unit and a second connecting unit connected to the TVS and to a first side of motor windings. The motor drive comprises a third connecting unit and a fourth connecting unit connected to the TVS and to a second side of the motor windings. The first side is opposite of the second side. The motor drive comprises a fifth connecting unit and a sixth connecting unit. The motor drive comprises a capacitor connected between the fifth connecting unit and the sixth connecting unit. The control unit triggers the first connecting unit, the third connecting unit and the sixth connecting unit to be in a connected state and the second connecting unit, the fourth connecting unit and the fifth connecting unit to be in a disconnected state such that the motor windings are connected to a positive pole of the TVS and the capacitor is connected to a negative pole of the TVS. The control unit triggers the first connecting unit, the third connecting unit and the sixth connecting unit to be in the disconnected state and the second connecting unit, the fourth connecting unit and the fifth connecting unit to be in the connected state such that the motor windings are connected to the negative pole of the TVS and the capacitor is connected to the positive pole of the TVS. By triggering the connecting units of the motor drive such that the capacitor becomes connected to the positive or negative pole of the TVS in opposite phase of the motor windings being connected to the positive or negative pole of the TVS, this provides an advantage of counteracting the swing in pole to chassis voltage. A further advantage is that the risk for common mode TVS voltage ripple is reduced or eliminated. A further advantage is that the risk of problems with e.g., electromagnetic interference is reduced or eliminated.

Optionally, the capacitor may be further connected to a second chassis ground.

Optionally, there may be a first capacitance between the motor windings and a first chassis ground. The capacitor may have a second capacitance, and the first capacitance and the second capacitance are approximately the same.

Optionally, the capacitor, the fifth connecting unit and the sixth connecting unit may be comprised in a filter.

Optionally, the first connecting unit, the second connecting unit, the third connecting unit, the fourth connecting unit, the fifth connecting unit and the sixth connecting unit may be mechanical connecting units or semiconductor units.

Optionally, the motor drive may comprise one or more sets of motor windings.

Optionally, the control unit may be a standalone unit adapted to communicate with the motor drive or the control unit may be integrated in the motor drive. An advantage of a standalone unit may be that it may be easy to replace and repair in case of failure. An advantage of a control unit integrated in the motor drive may be that it is located close to the other units comprised in the motor drive, which may be an advantage with respect reduced signalling delay, reduced length of connection cables etc.

According to a third aspect of the invention, the control unit is adapted to perform the method described above. Advantages and effects of the second aspect of the invention are similar to the advantages and effects with respect to the first aspect of the invention. It shall also be noted that all embodiments of the first aspect of the invention are applicable to and combinable with all embodiments of the third aspect of the invention and vice versa.

According to a fourth aspect of the invention, the at least partly electrically operated vehicle or vessel comprises the control unit described above. Advantages and effects of the third aspect of the invention are similar to the advantages and effects with respect to the first aspect of the invention. It shall also be noted that all embodiments of the first aspect of the invention are applicable to and combinable with all embodiments of the fourth aspect of the invention and vice versa.

According to a fifth aspect of the invention, the computer program comprises instructions which, when executed on at least one processor, cause the at least one processor to carry out the method according to the first aspect.

According to a sixth aspect of the invention, the carrier comprises the computer program of the fifth aspect, wherein the carrier is one of an electronic signal, optical signal, radio signal or computer readable storage medium.

The present invention is not limited to the features and advantages mentioned above. A person skilled in the art will recognize additional features and advantages upon reading the following detailed description.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are not necessarily to scale, and the dimensions of certain features may have been exaggerated for the sake of clarity. Emphasis is instead placed upon illustrating the principle.

DETAILED DESCRIPTION OF EXAMPLE EMBODIMENTS OF THE INVENTION

Figure 3:
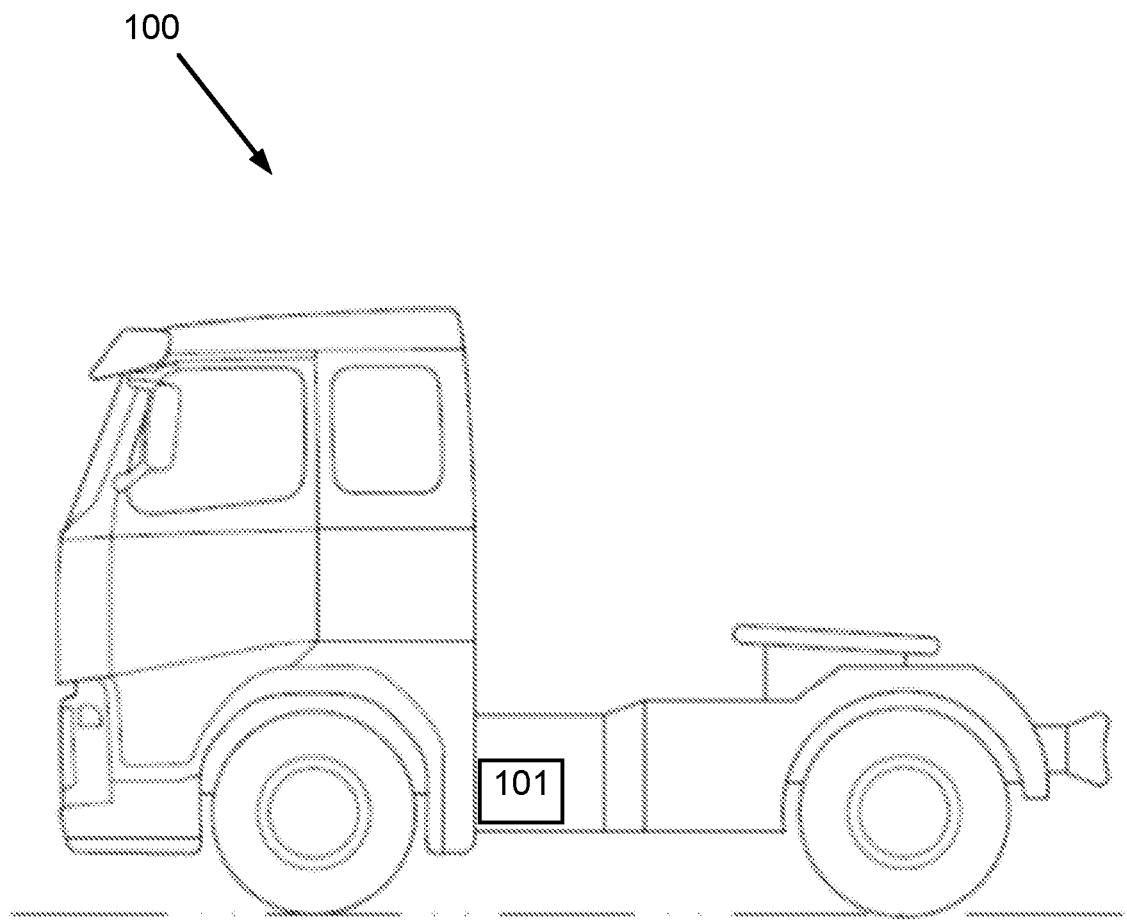
FIG. 3 is a schematic drawing illustrating an at least partly electrically operated vehicle.

FIG. 3 illustrates an at least partly electrically operated vehicle 100. The term vehicle may be used herein when referring to the at least partly electrically operated vehicle 100 for the sake of simplicity. The vehicle 100 may be fully electrical driven or it may be partly electrical driven.

Figure 1:
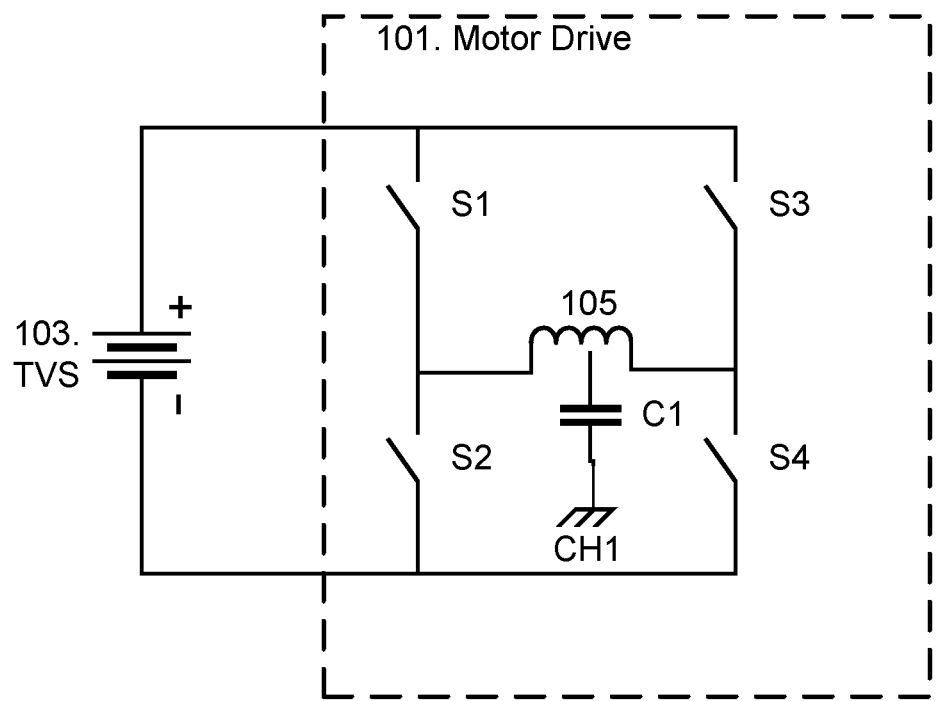
FIG. 1 is a schematic drawing illustrating a motor drive.
Figure 2:
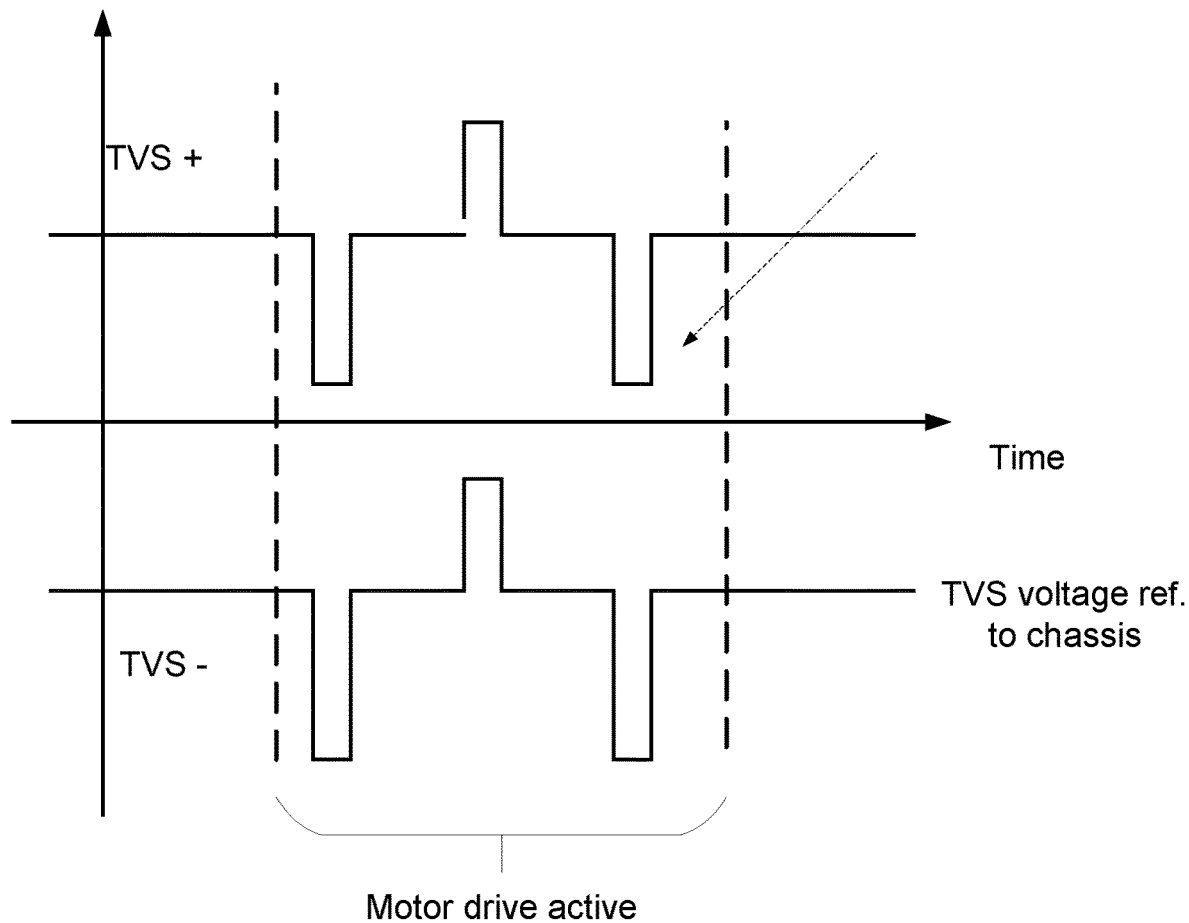
FIG. 2 is a graph illustrating a voltage.

The vehicle 100 may be a heavy-duty vehicle, such as a truck, bus, construction equipment, trailer, wheel loader, excavator, passenger car, a marine vessel, an electrically operated vessel, a working machine, stationary backup power solution etc., or any other type of vehicle mentioned herein. The vehicle 100 comprises a motor drive 101 and a TVS 103 (not illustrated in FIG. 2).

Figure 4:
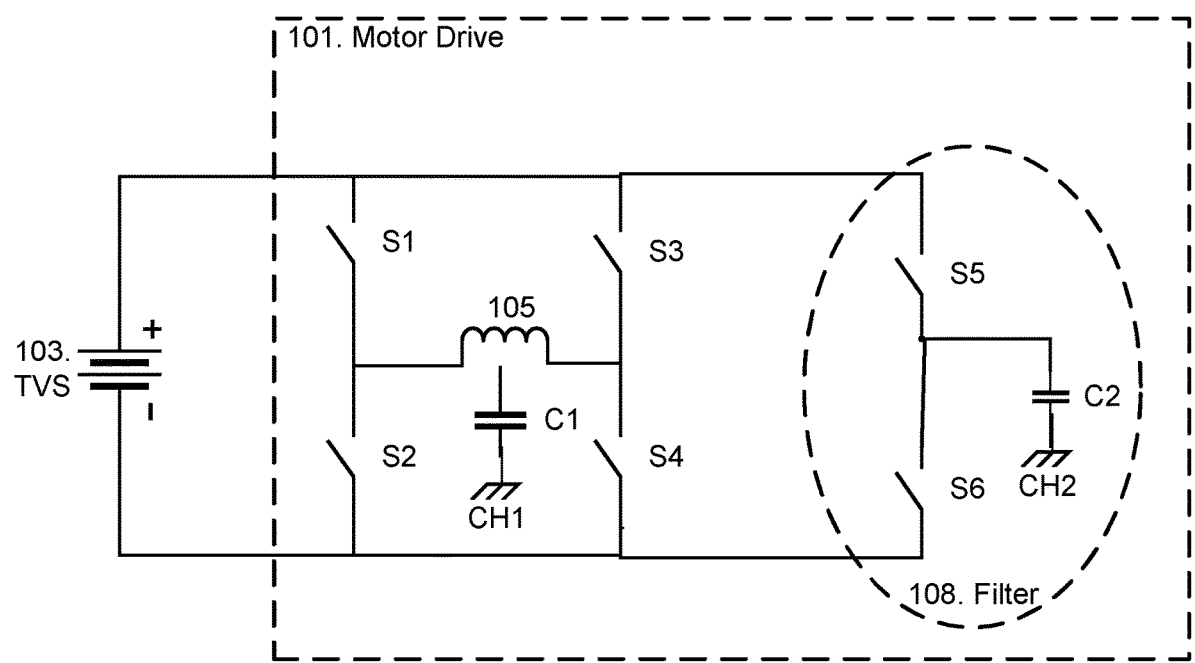
FIG. 4 is a schematic drawing illustrating a motor drive.

FIG. 4 illustrates a motor drive 101 connected to a TVS 103. The motor drive 101 and the TVS 101 are both comprised in the vehicle 100. The components of the motor drive 101 may be at least one or more of the ones within the dotted square in FIG. 4*a*. The motor drive 101 may be an Electric Motor Drive (EMD). The motor drive 101 may comprises one or more sets of motor windings 105.

The motor drive 101 comprises a first connecting unit S1, a second connecting unit S2, a third connecting unit S3, a fourth connecting unit S4, a fifth connecting unit S5 and a sixth connecting unit S6. The first connecting unit S1 and the second connecting unit S2 are on a first branch, e.g., a left branch, of the motor drive 101, the third connecting unit S3 and the fourth connecting unit S4 are on a second branch, e.g., a middle branch, of the motor drive 101 and the fifth connecting unit S5 and the sixth connecting unit S6 are on a third branch, e.g., a right branch, of the motor drive 101.

The first connecting unit S1 and the second connecting unit S2 are connected to the TVS 103 and to a first side of motor windings 105. The third connecting unit S3 and the fourth connecting unit S4 connected are to the TVS 103 and to a second side of the motor windings 105. The first side is opposite of the second side.

Each of the first connecting unit S1, the second connecting unit S2, the third connecting unit S3, the fourth connecting unit S4, the fifth connecting unit S5 and the sixth connecting unit S6 may any type of connecting units, such as for example switches, relays, transistors, Insulated Gate Bipolar Transistors (IGBT) etc. Each of the first connecting unit S1, the second connecting unit S2, the third connecting unit S3, the fourth connecting unit S4, the fifth connecting unit S5 and the sixth connecting unit S6 may be mechanical connecting units or semiconductor units.

Motor windings 105 are located between the first branch and the second branch. There may be one or more sets of motor windings 105 comprised in the motor drive 101. There may be for example two, three or more sets of motor windings 105.

There may be a first capacitance C1 between the motor windings 105 and a first chassis ground CH1. The first capacitance C1 may be stray capacitance.

A capacitor C2 is connected between the fifth connecting unit S5 and the sixth connecting unit S6. The capacitor C2 may have a second capacitance, and the first capacitance and the second capacitance may be approximately the same.

A second chassis ground CH2 is connected to the capacitance C2. The fifth connecting unit S5, the sixth connecting unit S6, the capacitor C2 and the second chassis ground CH2 may be comprised in a filter 108 (indicated with a dotted circle). The capacitor C2 is a dedicated capacitor connected between the chassis ground CH2 and the TVS positive or negative pole in opposite phase to the switching of the motor drive 101 to counteract or at least reduce the swing in pole-to-chassis voltage.

The TVS 103 has a positive pole + and a negative pole −.

Each of the connecting units S1-S6 may be in a connected state or a disconnected state according to a certain cycle, e.g., a connecting cycle or switching cycle. For example, three of the connecting units may be in a connected state while the other three connecting units may be in a disconnected state. An example of this is provided below in Table 1 below:

TABLE 1

|  | Switching cycle A | Switching cycle B |
| --- | --- | --- |
| First connecting unit S1 | Connected state | Disconnected state |
| Second connecting unit S2 | Disconnected state | Connected state |
| Third connecting unit S3 | Connected state | Disconnected state |
| Fourth connecting unit S4 | Disconnected state | Connected state |
| Fifth connecting unit S5 | Disconnected state | Connected state |
| Sixth connecting unit S6 | Connected state | Disconnected state |

The disconnected state may be referred to as an open state, an unlocked state, a first state, off state etc. The connected state may be referred to as a closed state, a locked state, a second state, an on state etc. When the motor drive 101 is not operating, i.e., it is inactive, then connecting units S1-S6 may be in disconnected state. The disconnected state of the connecting units S1-S6 when the motor drive 101 may be a default state, i.e., the connecting units S1-S6 may be open when the motor drive 101 is not operating.

The switching cycles exemplified above may take place when the motor drive 101 is active, i.e., when it is running.

The state of the connecting units S1-S6 may be triggered by a control unit 110 which will be described in more detail below.

Figure 5:
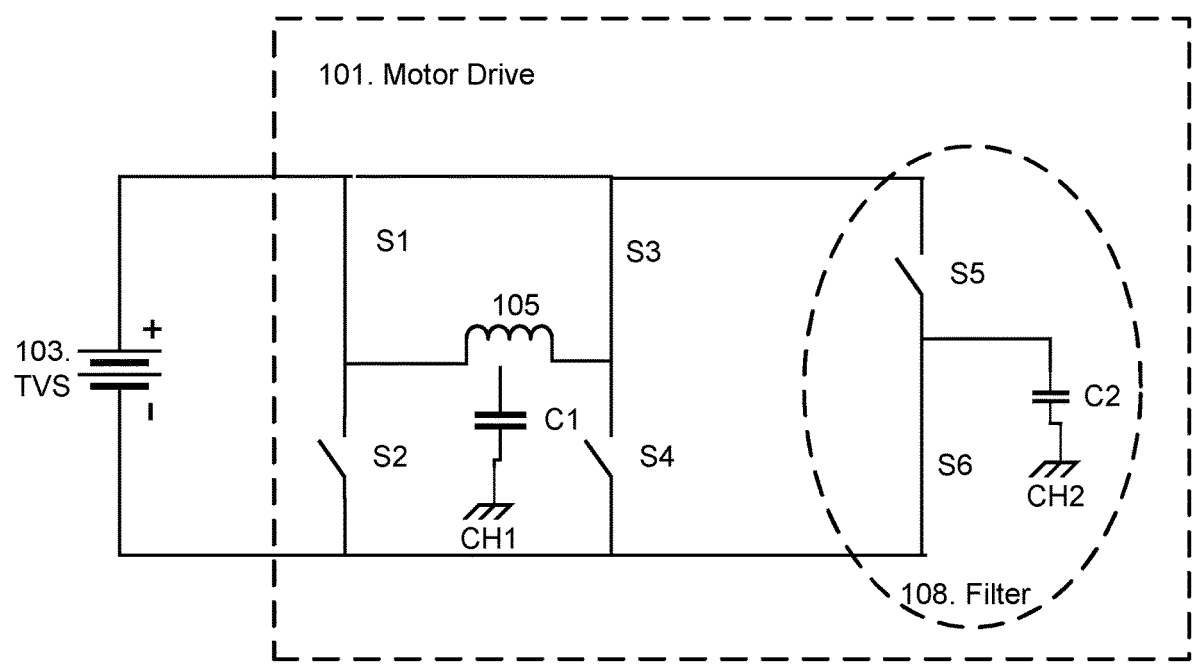
FIG. 5 is a schematic drawing illustrating a motor drive.
Figure 6:
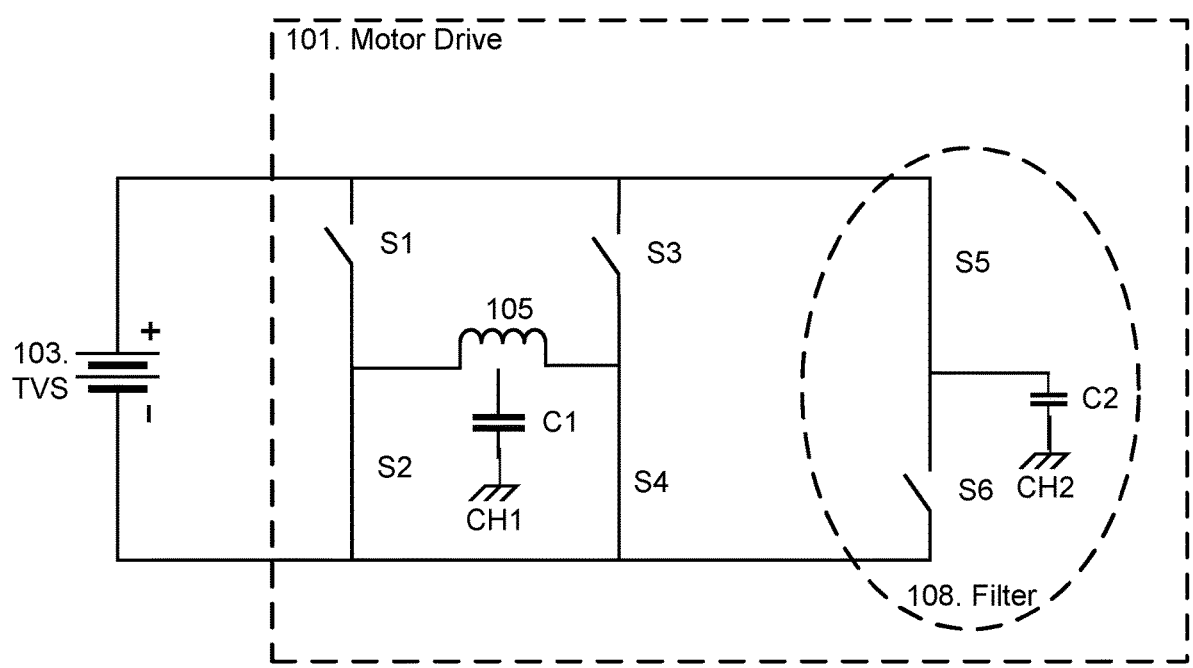
FIG. 6 is a schematic drawing illustrating a motor drive.

Switching cycle A in Table 1 is also illustrated in FIG. 5, and switching cycle B is illustrated in FIG. 6.

The result of switching cycle A, is that, when the motor drive 101 is active, the motor windings 105 are connected to a positive pole of the TVS 103 and the capacitor C2 is connected to a negative pole of the TVS 103. Using other words, the motor windings 105 are connected to a positive pole of the TVS 103 and the capacitor C2 is connected to a negative pole of the TVS 103 when the first connecting unit S1, the third connecting unit S3 and the sixth connecting unit S6 are in a connected state and when the second connecting unit S2, the fourth connecting unit S4 and the fifth connecting unit S5 are in a disconnected state.

The result of the switching cycle B is that, when the motor drive 101 is active, the motor windings 105 are connected to the negative pole of the TVS 103 and the capacitor C2 is connected to the positive pole of the TVS 103. Using other words, the motor windings 105 are connected to the negative pole of the TVS 103 and the capacitor C2 is connected to the positive pole of the TVS 103 when the first connecting unit S1, the third connecting unit S3 and the sixth connecting unit S6 are in the disconnected state and when the second connecting unit S2, the fourth connecting unit S4 and the fifth connecting unit S5 are in the connected state.

When the first capacitance C1 is connected to the positive pole of the TVS 103, the capacitor C2 is connected to the negative pole of the TVS 103. If the first capacitance C1 is approximately the same as the second capacitance of the capacitor C2, then the voltage swing is minimized.

The control unit 110 may be adapted to determine the size or magnitude of first capacitance C1, the second capacitance and or both the first capacitance C1 and the second capacitance. The size or magnitude of the first capacitance C1 may be known by the control unit 110, it may be known with some uncertainty or margin or it may be unknown to the control unit 110. The control unit 110 may be adapted to dynamically adjust the second capacitance of the capacitor C2 such that it is approximately the same as the first capacitance C1. The control unit 110 may be adapted to determine the voltage ripple and to dynamically adjust the second capacitance of the capacitor C2 based on the voltage ripple.

The voltage ripple may also be referred to as voltage swing, voltage jumps, noise. The voltage ripple may be a swing in pole-to-chassis voltage, it may be a common TVS voltage ripple. The voltage ripple may lead to problems with for example electromagnetic interference, which may be counteracted or at least reduced with the present invention when the first capacitance and the second capacitance are approximately the same.

There may be an alternation between the two switching cycles A and B, and this alternation may be triggered and controlled by the control unit 110.

Summarized, the motor windings 105 are connected to a positive pole of the TVS 103 and the capacitor C2 is connected to a negative pole of the TVS 103 when the first connecting unit S1, the third connecting unit S3 and the sixth connecting unit S6 are in a connected state and when the second connecting unit S2, the fourth connecting unit S4 and the fifth connecting unit S5 are in a disconnected state. The motor windings 105 are connected to the negative pole of the TVS 103 and the capacitor C2 is connected to the positive pole of the TVS 103 when the first connecting unit S1, the third connecting unit S3 and the sixth connecting unit S6 are in the disconnected state and when the second connecting unit S2, the fourth connecting unit S4 and the fifth connecting unit S5 are in the connected state.

Figure 7:
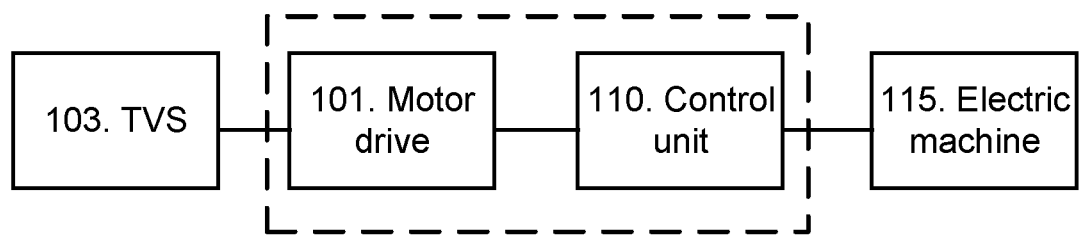
FIG. 7 is a schematic block diagram illustrating a TVS, motor drive, control unit and electric machine.

FIG. 7 is a block diagram illustrating the TVS 103 adapted to be connected to the motor drive 101. The motor drive 101 is adapted to be connected to or to be co-located (illustrated with the dotted box) with a control unit 110. In other words, the control unit 110 may be a standalone unit adapted to be connected to and to communicate with the motor drive 101, or the control unit 110 may be integrated in or co-located with the motor drive 101. The control unit 110 may be adapted to be connected to an electric machine 115 comprised in the vehicle 100.

Figure 8:
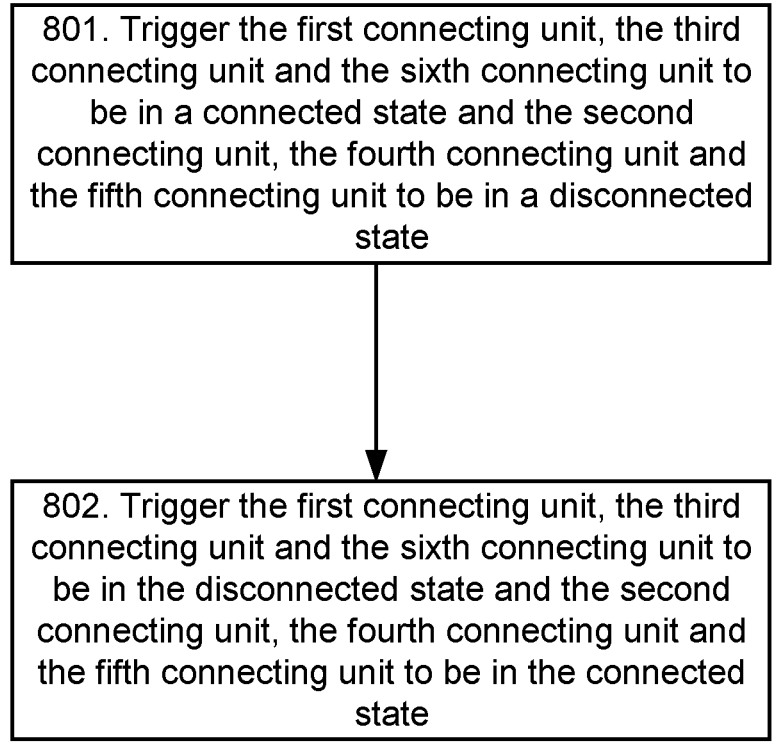
FIG. 8 is a flow chart illustrating a method.

The control unit 110 is adapted to handle connection between the motor drive 101 and the TVS 103 in the at least partly electrically operated vehicle 100. The method for handling the connection between the motor drive 101 and the TVS 103 in the vehicle 100 is illustrated in FIG. 8. The method seen in FIG. 8 comprises at least one of the following steps to be performed by the control unit 110, which steps may be performed in any suitable order than described below:

Step 801

The control unit 110 triggers the first connecting unit S1, the third connecting unit S3 and the sixth connecting unit S6 to be in a connected state and the second connecting unit S2, the fourth connecting unit S4 and the fifth connecting unit S5 to be in a disconnected state such that the motor windings 105 are connected to a positive pole of the TVS 103 and the capacitor C2 is connected to a negative pole of the TVS 103.

Step 801 may take place when the motor drive 101 is active, i.e., that it is running or operating.

This step 801 may correspond to switching cycle A in Table 1.

The trigger may be in the form of one or more signal(s) or instruction(s) sent to the first connecting unit S1, the second connecting unit S2, the third connecting unit S3, the fourth connecting unit S4, the fifth connecting unit S5 and the sixth connecting unit S6.

The first connecting unit S1, the third connecting unit S3 and the sixth connecting unit S6 enters the connected state and the second connecting unit S2, the fourth connecting unit S4 and the fifth connecting unit S5 enters the disconnected state as a result of the trigger. The first connecting unit S1, the third connecting unit S3 and the sixth connecting unit S6 are then in a connected state at the same time as the second connecting unit S2, the fourth connecting unit S4 and the fifth connecting unit S5 are in the disconnected state.

Step 802

The control unit 110 triggers the first connecting unit S1, the third connecting unit S3 and the sixth connecting unit S6 to be in the disconnected state and the second connecting unit S2, the fourth connecting unit S4 and the fifth connecting unit to be in the connected state such that the motor windings 105 are connected to the negative pole of the TVS 103 and the capacitor C2 is connected to the positive pole of the TVS 103.

Step 802 may take place when the motor drive 101 is active, i.e., that it is running or is operative.

This step 802 may correspond to switching cycle B in Table 1.

The trigger may be in the form of one or more signal(s) or instruction(s) sent to the first connecting unit S1, the second connecting unit S2, the third connecting unit S3, the fourth connecting unit S4, the fifth connecting unit S5 and the sixth connecting unit S6.

The first connecting unit S1, the third connecting unit S3 and the sixth connecting unit S6 enters the disconnected state and the second connecting unit S2, the fourth connecting unit S4 and the fifth connecting unit S5 enters the connected state as a result of the trigger. The first connecting unit S1, the third connecting unit S3 and the sixth connecting unit S6 are then in a disconnected state at the same time as the second connecting unit S2, the fourth connecting unit S4 and the fifth connecting unit S5 are in the connected state.

Step 801 may be performed first and then step 802 may be performed, or step 802 may be performed first and then step 801.

The capacitor C2 may be further connected to a second chassis ground CH2.

There may be a first capacitance C1 between the motor windings 105 and a first chassis ground CH1. The second capacitor C2 may have a second capacitance, and the first capacitance and the second capacitance may be approximately the same, i.e. C1≈C2. When the first capacitance and the second capacitance are approximately the same, they may be for example: C1±n=C2±m, where n and m are any suitable numbers. When the first capacitance C1 is connected to the positive pole of the TVS 103 and the second capacitor C2 is connected to the negative pole of the TVS 103, and if the first capacitance and the second capacitance are approximately the same, then voltage swings in the motor drive 103 may be minimized.

The control unit 110 may determine the size or magnitude of first capacitance C1, the second capacitance or both the first capacitance C1 and the second capacitance. The size or magnitude of the first capacitance C1 may be known by the control unit 110, it may be known with some uncertainty or margin or it may be unknown to the control unit 110. The control unit 110 may dynamically adjust the second capacitance of the capacitor C2 such that it is approximately the same as the first capacitance C1. The control unit 110 may determine the voltage ripple and to dynamically adjust the second capacitance of the capacitor C2 based on the voltage ripple.

The capacitor C2, the fifth connecting unit S5 and the sixth connecting unit S6 may be comprised in a filter.

The first connecting unit S1, the second connecting unit S2, the third connecting unit S3, the fourth connecting unit S4, the fifth connecting unit S5 and the sixth connecting unit S6 may be mechanical connecting units or semiconductor devices.

The motor drive 101 may comprise one or more sets of motor windings 105.

The control unit 110 may be a standalone unit adapted to communicate with the motor drive 101, or the control unit 110 may be integrated in the motor drive 101.

Figure 9:
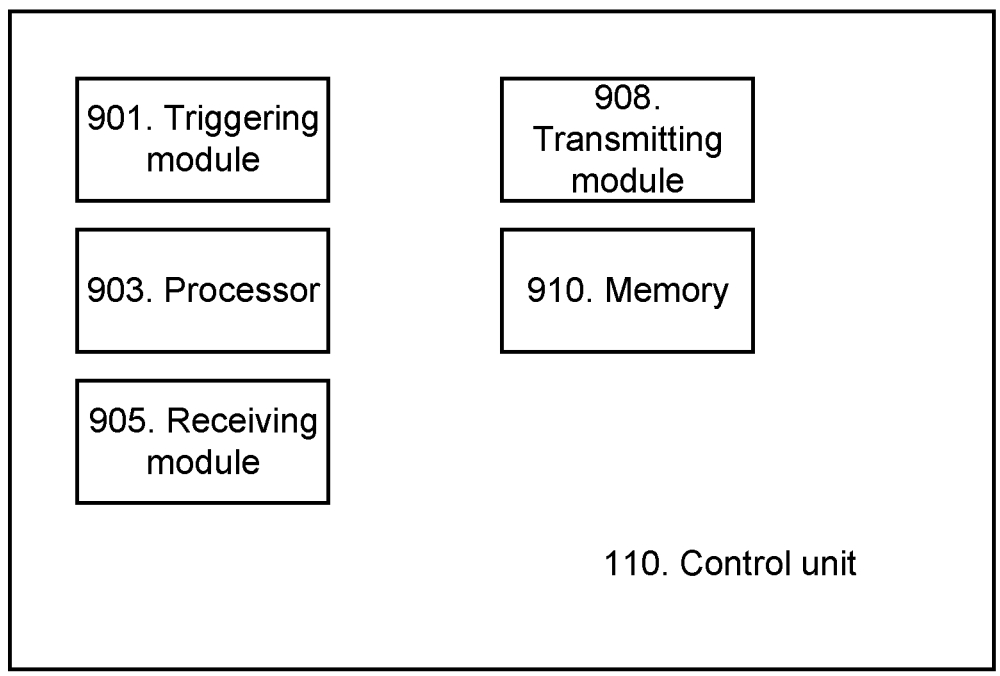
FIG. 9 is a schematic block diagram illustrating a control unit.

The control unit 110 is adapted to perform the method described herein. To perform the method steps shown in FIG. 8 for handling connection between a motor drive 101 and a TVS 103 in an at least partly electrically operated vehicle 100, the control unit 110 may comprise an arrangement as shown in FIG. 9.

The control unit 110 is adapted to, e.g., by means of a triggering module 901, trigger the first connecting unit, the third connecting unit and the sixth connecting unit to be in a connected state and the second connecting unit S2, the fourth connecting unit S4 and the fifth connecting unit S5 to be in a disconnected state such that the motor windings 105 are connected to a positive pole of the TVS 103 and the capacitor C2 is connected to a negative pole of the TVS 103. The triggering module 901 may also be referred to as a triggering unit, a triggering means, a triggering circuit, means for triggering etc. The triggering module 901 may be a processor 903 of the control unit 10 or comprised in the processor 903 of the control unit 110. The motor drive 101 may be active, i.e., it may be running or operative, when the triggering is performed.

The control unit 110 is adapted to, e.g., by means of a triggering module 901, trigger the first connecting unit S1, the third connecting unit S3 and the sixth connecting unit S6 to be in the disconnected state and the second connecting unit S2, the fourth connecting unit S4 and the fifth connecting unit to be in the connected state such that the motor windings 105 are connected to the negative pole of the TVS 103 and the capacitor C2 is connected to the positive pole of the TVS 103. The motor drive 101 may be active, i.e., it may be running or operative, when the triggering is performed.

The capacitor C2 may be further connected to a second chassis ground CH2.

There may be a first capacitance C1 between the motor windings 105 and a first chassis ground CH1. The capacitor C2 may have a second capacitance, and the first capacitance and the second capacitance may be approximately the same, i.e., C1≈C2. When the first capacitance and the second capacitance are approximately the same, they may be for example: C1±n=C2±m, where n and m are any suitable numbers. When the first capacitance C1 is connected to the positive pole of the TVS 103 and the second capacitor C2 is connected to the negative pole of the TVS 103, and if the first capacitance and the second capacitance are approximately the same, then voltage swings in the motor drive 103 may be minimized.

The control unit 110 may be adapted to determine the size or magnitude of first capacitance C1, the second capacitance or both the first capacitance C1 and the second capacitance. The size or magnitude of the first capacitance C1 may be known by the control unit 110, it may be known with some uncertainty or margin or it may be unknown to the control unit 110. The control unit 110 may be adapted to dynamically adjust the second capacitance of the capacitor C2 such that it is approximately the same as the first capacitance C1. The control unit 110 may be adapted to determine the voltage ripple and to dynamically adjust the second capacitance of the capacitor C2 based on the voltage ripple.

The capacitor C2, the fifth connecting unit S5 and the sixth connecting unit S6 may be comprised in a filter.

The first connecting unit S1, the second connecting unit S2, the third connecting unit S3, the fourth connecting unit S4, the fifth connecting unit S5 and the sixth connecting unit S6 may be mechanical connecting units or semiconductor units.

The motor drive 101 may comprises one or more sets of motor windings 105.

The control unit 110 may be a standalone unit adapted to communicate with the motor drive 101, or the control unit 110 may be integrated in the motor drive 101.

The control unit 110 may comprise a receiving module 905 adapted to receive signals, information, instructions, triggers, measurements etc. from other modules comprised in the control unit 110, from other units comprised in the motor drive 101, from the motor drive, from the electric machine 115, from the TVS 103 etc. The receiving module 905 may also be referred to as a receiving unit, a receiving means, a receiving circuit, means for receiving, input unit etc. The receiving module 905 may be a receiver, a transceiver etc. The receiving module 905 may be a wireless or wired receiver of the control unit 110.

The control unit 110 may comprise a transmitting module 908 adapted to transmit signals, information, instructions, triggers, measurements etc. to other modules comprised in the control unit 110, to other units comprised in the motor drive 101, to the motor drive, to the electric machine 115, to the TVS 103 etc. The transmitting module 908 may also be referred to as a transmitting unit, a transmitting means, a transmitting circuit, means for transmitting, output unit etc. The transmitting module 908 may be a transmitter, a transceiver etc. The transmitting module 908 may be a wireless or wired transmitter of the control unit 110.

The control unit 115 may comprises the processor 903 and a memory 910. The memory 910 comprises instructions executable by the processor 903.

The control unit 110 may be in the form of any suitable computer processor. The control unit 110 may or may not have a user interface (not shown in FIG. 9) on which a user or an operator may control and monitor the operations of the control unit 110 etc.

A computer program may comprise instructions which, when executed on at least one processor, e.g., the processor 903, cause the at least one processor to carry out the method described herein. A carrier may comprise the computer program, and the carrier may be one of an electronic signal, optical signal, radio signal or computer readable storage medium.

The method described herein for handling connection between a motor drive 101 and the TVS 103 in an at least partly electrically operated vehicle 100 may be implemented through one or more processors, such as the processor 903 in the control unit 110 illustrated in FIG. 9, together with computer program code for performing the functions of the embodiments herein. The processor may be for example a Digital Signal Processor (DSP), Application Specific Integrated Circuit (ASIC) processor, Field-programmable gate array (FPGA) processor or microprocessor. The program code mentioned above may also be provided as a computer program product, for instance in the form of a data carrier carrying computer program code for performing the embodiments herein when being loaded into the control unit 110. One such carrier may be in the form of a CD ROM disc. It is however feasible with other data carriers such as a memory stick. The computer program code can furthermore be provided as pure program code on a server and downloaded to the control unit 110.

The at least partly electrically operated vehicle 100 comprising the motor drive 101 and the control unit 110, as described herein.

Summarized, the present invention relates to common mode noise suppression in the motor drive 101. A dedicated capacitor C2 is connected between each of the TVS positive pole and ground and TVS negative pole and ground. The capacitor C2 will be alternately engaged depending on the phase of the switching cycle. Thus, the swing in pole-to-chassis voltage is counteracted.

In general, the usage of "first", "second", "third", "fourth", and/or "fifth" herein may be understood to be an arbitrary way to denote different elements or entities and may be understood to not confer a cumulative or chronological character to the nouns they modify, unless otherwise noted, based on context.

The term "at least one of A and B" should be understood to mean "only A, only B, or both A and B.", where A and B are any parameter, number, indication used herein etc.

It should be emphasized that the term "comprises/comprising" when used in this specification is taken to specify the presence of stated features, integers, steps or components, but does not preclude the presence or addition of one or more other features, integers, steps, components or groups thereof. It should also be noted that the words "a" or "an" preceding an element do not exclude the presence of a plurality of such elements.

The term "configured to" used herein may also be referred to as "arranged to", "adapted to", "capable of" or "operative to".

The steps of the methods may be performed in another order than the order in which they appear herein.

The invention claimed is:

1. A motor drive in an at least partly electrically operated vehicle, wherein the motor drive comprises:
    a first connecting unit and a second connecting unit connected to a Traction Voltage System ("TVS") and to a first side of motor windings;
    a third connecting unit and a fourth connecting unit connected to the TVS and to a second side of the motor windings, wherein the first side is opposite of the second side;
    a fifth connecting unit and a sixth connecting unit;
    a capacitor connected between the fifth connecting unit and the sixth connecting unit;
    wherein the motor windings are connected to a positive pole of the TVS and the capacitor is connected to a negative pole, and not the positive pole, of the TVS when the first connecting unit, the third connecting unit and the sixth connecting unit are in a connected state and when the second connecting unit, the fourth connecting unit and the fifth connecting unit are in a disconnected state,
    wherein the motor windings are connected to the negative pole of the TVS and the capacitor is connected to the positive pole, and not the negative pole, of the TVS when the first connecting unit, the third connecting unit and the sixth connecting unit are in the disconnected state and when the second connecting unit, the fourth connecting unit and the fifth connecting unit are in the connected state.

2. The motor drive according to claim 1, wherein the capacitor is further connected to a second chassis ground.

3. The motor drive according to claim 1, wherein there is a first capacitance between the motor windings and a first chassis ground, wherein the capacitor has a second capacitance, and wherein the first capacitance and the second capacitance are approximately the same.

4. The motor drive according to claim 1, wherein the capacitor, the fifth connecting unit and the sixth connecting unit are comprised in a filter.

5. The motor drive according to claim 1, wherein the first connecting unit, the second connecting unit, the third connecting unit, the fourth connecting unit, the fifth connecting unit and the sixth connecting unit are mechanical connecting units or semiconductor units.

6. The motor drive according to claim 1, wherein the motor drive comprises one or more sets of motor windings.

7. The at least partly electrically operated vehicle comprising the motor drive according to claim 1.

8. A method performed by a control unit for handling connection between a motor drive and a Traction Voltage System; ("TVS"), in an at least partly electrically operated vehicle, wherein the motor drive comprises:
    a first connecting unit and a second connecting unit connected to the TVS and to a first side of motor windings;
    a third connecting unit and a fourth connecting unit connected to the TVS and to a second side of the motor windings, wherein the first side is opposite of the second side;
    a fifth connecting unit and a sixth connecting unit;
    a capacitor connected between the fifth connecting unit and the sixth connecting unit; the method comprising:
    triggering the first connecting unit, the third connecting unit and the sixth connecting unit to be in a connected state and the second connecting unit, the fourth connecting unit and the fifth connecting unit to be in a disconnected state such that the motor windings are connected to a positive pole of the TVS and the capacitor is connected to a negative pole, and not the positive pole, of the TVS;
    and triggering the first connecting unit, the third connecting unit and the sixth connecting unit to be in the disconnected state and the second connecting unit, the fourth connecting unit and the fifth connecting unit to be in the connected state such that the motor windings are connected to the negative pole of the TVS and the capacitor is connected to the positive pole, and not the negative pole of the TVS.

9. The method according to claim 8, wherein the capacitor is further connected to a second chassis ground.

10. The method according to claim 8, wherein there is a first capacitance between the motor windings and a first chassis ground,
    wherein the second capacitor has a second capacitance, and wherein the first capacitance and the second capacitance are approximately the same.

11. The method according to claim 8, wherein the first connecting unit, the second connecting unit, the third connecting unit, the fourth connecting unit, the fifth connecting unit and the sixth connecting unit are mechanical connecting units or semiconductor units.

12. The method according to claim 8, wherein the control unit is a standalone unit adapted to communicate with the motor drive, or wherein the control unit is integrated in the motor drive.

13. The control unit for handling connection between the motor drive and the TVS, in the at least partly electrically operated vehicle, the control unit being configured to perform the steps of the method according to claim 8.

14. A non-transitory computer readable medium carrying a computer program comprising program code for performing the steps of claim 8 when said program code is run on a computer.

* * * * *